(12) United States Patent
Ezell

(10) Patent No.: US 6,218,899 B1
(45) Date of Patent: Apr. 17, 2001

(54) METHOD FOR A HIGHLY LINEAR VARIABLE-GAIN LOW NOISE AMPLIFIER

(75) Inventor: Richard William Ezell, Carrollton, TX (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 09/548,071

(22) Filed: Apr. 12, 2000

Related U.S. Application Data

(63) Continuation of application No. 09/167,350, filed on Oct. 7, 1998, now Pat. No. 6,100,761.

(51) Int. Cl.[7] .................................................. H03F 3/45
(52) U.S. Cl. ................................... 330/254; 330/261
(58) Field of Search ......................... 330/254, 285, 330/129, 261, 252; 327/359, 561, 562, 563

(56) References Cited

U.S. PATENT DOCUMENTS

| | | | | |
|---|---|---|---|---|
| 3,761,741 | * | 9/1973 | Hoeft | 307/237 |
| 4,929,908 | * | 5/1990 | Imanishi | 330/254 |
| 5,610,557 | * | 3/1997 | Jett, Jr. | 330/261 |

* cited by examiner

*Primary Examiner*—Robert Pascal
*Assistant Examiner*—Henry Choe
(74) *Attorney, Agent, or Firm*—Fulbright & Jaworski L.L.P.

(57) ABSTRACT

A highly linear variable-gain low noise amplifier is constructed using a transistor pair having variable gain control. The gain of the transistor pair is achieved by a segmented resistor having controllable PMOS (or NMOS) components. The circuit includes a variable voltage source and operates to handle wideband radio transmissions via broadcast or cable.

30 Claims, 3 Drawing Sheets

METHOD FOR A HIGHLY LINEAR VARIABLE-GAIN LOW NOISE AMPLIFIER

RELATED APPLICATIONS

This application is a continuation of application Ser. No. 09/167,350, titled, HIGHLY LINEAR VARIABLE-GAIN LOW NOISE AMPLIFIER, now issued as U.S. Pat. No. 6,100,761 filed on Oct. 7, 1998, which is incorporated herein by reference.

TECHNICAL FIELD OF THE INVENTION

This invention relates to amplifier circuits and to amplifiers which are used in tuners and even more specifically to such amplifiers where variable-gain low noise amplification is required.

BACKGROUND

U.S. Pat. No. 5,737,035 dated Apr. 7, 1998, shows a tuner circuit. The front end of such a tuner requires a broadband, highly linear Variable-gain Low Noise Amplifier (VLNA). The VLNA's input comes from either an antenna for wireless broadcasts or from a coaxial cable for cable transmission. The output of the VLNA supplies the input of the first up-converting mixer. The noise figure specification for the VLNA is highly critical, and has the highest impact on the overall noise figure of the system. Non-linearities of the amplifier also have a large effect on the proper operation of the tuner.

LNA's are typically used to meet cellular requirements, which are narrow-band. However, a television tuner must receive carriers from 50 MHZ to over 860 MHz. A narrow bandwidth system also has less stringent linearity specifications because fewer intermodulation distortion products fall in-band. Finally, because the incoming signal power to a tuner can vary by many orders of magnitude, there is a need for an LNA whose gain is continuously-variable. The gain variability function adds noise, distortion, and complexity to the LNA.

Accordingly, there exists a need in the art for a low noise amplifier which can handle a wide frequency range as well as a wide amplification range.

A further need exists in the art for such a circuit which can be constructed on a single substrate and which will not be effected by, nor produce, noise injection.

SUMMARY OF THE INVENTION

These and other objects, features and technical advantages are achieved by a system and method which meets the noise, linearity, and gain ranges required in wideband tuners by using a segmented resistor and MOS structure in the signal path to vary the gain of a bipolar (or MOS) transistor amplifier. The system includes a method for both biasing the device and controlling the gain using a differential voltage input. Both PMOS, and NMOS transistors are used and operated in their triode mode to preserve linearity and low noise. The circuit operates for transmission signals received via air wave broadcast or via cable and can handle wide ranges of amplification requirements as well as intermodulation constraints.

It is a technical feature of my invention to provide a VLNA which utilizes a pseudo differential structure to reduce the effects of on-chip substrate injection and supply line fluctuations.

It is another technical feature of my invention to provide a circuit where the gain of the amplifier changes in a linear and predictable fashion with the controlling voltage input.

It is a further technical feature of my invention that such a circuit is constructed to produce a large gain range, having low noise, capable of operating across a wide bandwidth.

It is a further technical feature of my invention to provide such a circuit and method which is self biasing.

It is a further technical feature of my invention to provide such a circuit which will operate with circuits which require either a high constant output intercept or a high constant input intercept.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE INVENTION

Figure 1:
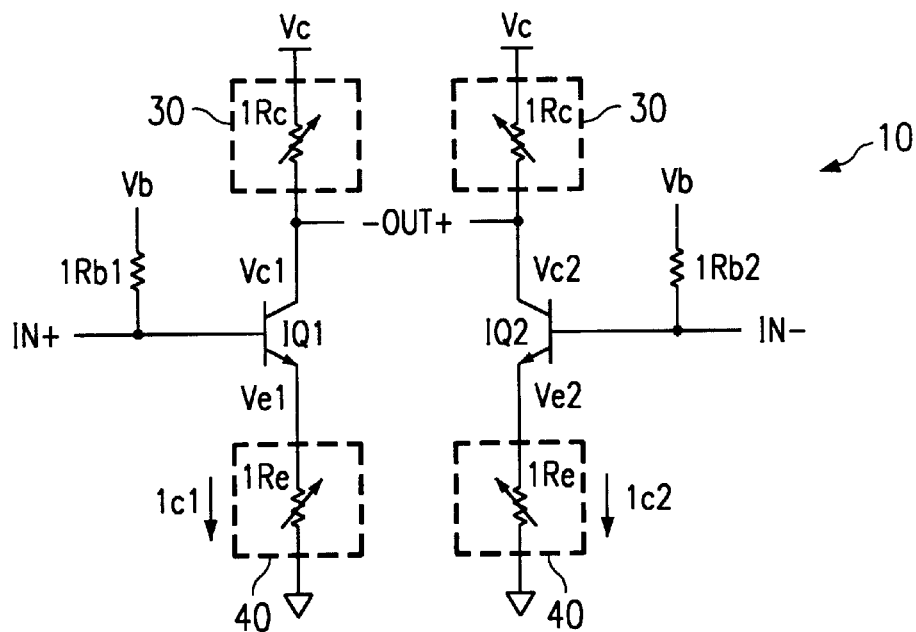
FIG. 1 shows the overall bipolar transistor circuit of the amplifier.

The preferred embodiment of the invention employs a variation of a resistively-loaded NPN transconductance pair, 10, which includes transistors 1Q1 and 1Q2, as seen in FIG. 1. As shown, both 1Re and 1Rc are continuously variable, to change the overall gain of the block. The voltage gain, A, is given by Equation 1, where "gm" refers to the transconductance of transistors 1Q1 and 1Q2.

$$A = \frac{1Rc}{1/\text{gm} + 1Re} \quad \text{(Eq. 1)}$$

As can be seen, if the gm of the transistors is high enough, A is set by 1Rc/1Re. This allows the gain to be affected by varying either of these quantities, depending on specific desired qualities.

To reach maximum gain (Amax), resistor 1Rc is placed at its maximum value and resistor 1Re at its minimum. Gain reduction from Amax is accomplished by first increasing 1Re and then decreasing 1Rc. Varying these resistances produces other effects, as well.

For a given bias current through transistors 1Q1 and 1Q2, increasing 1Re decreases gain. Additionally, the Third-order Output Intercept Point (OIP3), which is a chief measure of linearity, remains relatively unaffected, while the Third-order Input Intercept Point (IIP3) increases. The noise figure of the device increases approximately one-half dB per dB of gain decrease.

Decreasing 1Rc decreases gain for a given bias current, and also reduces OIP3. However, IIP3 remains constant, while the noise figure increases a full dB per dB of gain decrease.

Figure 2:
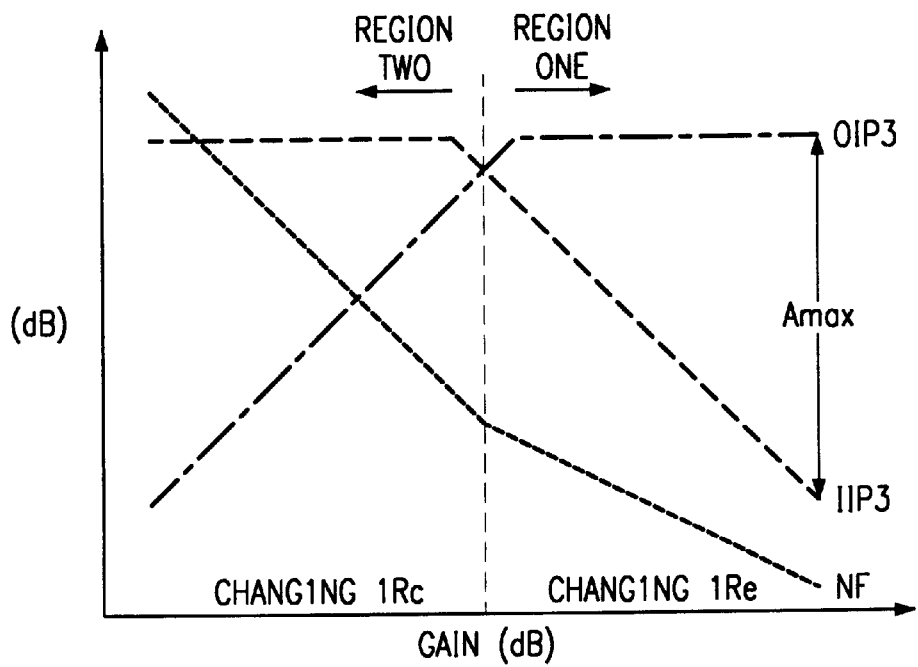
FIG. 2 is a graph showing the effects of varying the effective resistances of the circuit of FIG. 1.

As can be seen in FIG. 2, these behaviors cause distinctly different operating characteristics, depending on the gain selected. Region One behavior is exhibited while changing 1Re, while Region Two has 1Rc changing.

These two regions define two different applications for the tuner system as a whole. When the VLNA is supplied by a cable system, a multitude of carriers exist at its input, each with a similar limited power range. These multiple signals cause a large number of possible cross-modulated products, requiring very high output linearity, or OIP3, in the amplifier. Region One is defined such that it encompasses the range of power supplied from different cable systems.

When the VLNA is fed by an antenna, the amplifier must deal with far fewer carriers which are typically tightly regulated as to channel spacing and power, such that channel-to-channel interference is reduced thereby reducing the need for high linearity in the front end. A single channel, however, may contain much higher power than would be seen in a cable system thereby requiring a much lower level of gain. In this case the noise figure may be degraded by a larger amount, but a larger input linearity, or IIP3, must be maintained to avoid input compression. Region Two shows these characteristics.

The above observations about input and output intercept show general trends that will occur if the 1Rc and 1Re resistances are varied linearly, and if the resistors themselves remain non-distortive. The distortion due to the non-constant gm of the bipolar transistors will then dominate. However, anything with a transconductance that can be changed, i.e. 1Rc and 1Re, will be an active device, and have non-linearities of its own which must be controlled. While simple in concept, changing 1Rc and 1Re in an analog and predictable manner is quite difficult. As will be discussed in more detail hereinafter, the circuit uses a network of resistors and MOS devices to overcome this difficulty.

Figure 3:
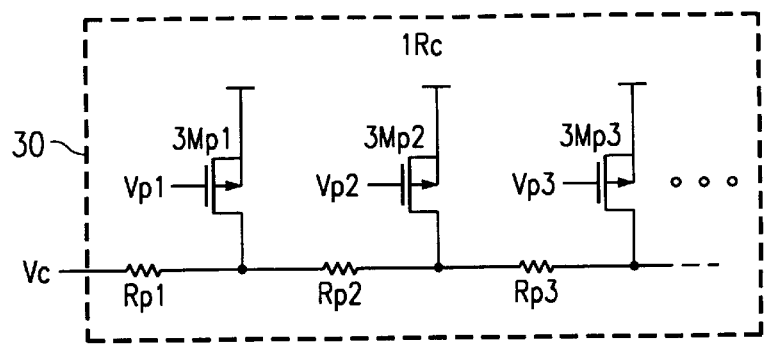
FIGS. 3 and 4 show the details of the segmented resistors of FIG. 1.
Figure 4:
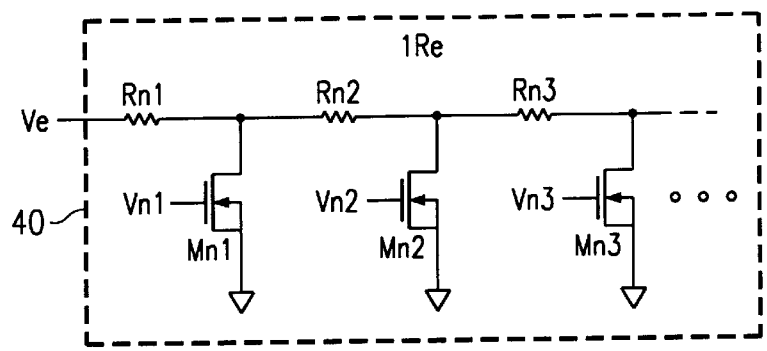

FIGS. 3 and 4 illustrate a preferred embodiment of resistors 1Rc and 1Re, respectively, which are variable, highly linear resistors. The nodes "Ve" and "Vc" correspond to the respective points in FIG. 1. The control voltages Vp1, Vp2, Vp3, change the effective resistance of 1Rc by changing the gate voltages of PMOS devices 3Mp1, 3Mp2, 3Mp3, etc., and voltages Vn1, Vn2, Vn3, etc., likewise control 1Re (FIG. 4). All subsequent discussion will describe 1Re, which uses NMOS transistors. The operation of 1Rc (FIG. 3) may be understood by inverting the sense of the described control voltages Vp1, Vp2, Vp3, etc. (discussed with respect to FIGS. 6 and 7).

To set 1Re to its minimum resistance, all of the Vnx (where x can be any number 1, 2, 3, etc.) control lines are set to the highest available voltage. Due to bias conditions on Ve and the choice of values of Rnx, all of the MOS devices will be in a triode mode of operation. This gives a predictable drain-to-source resistance, inversely proportional to the gate voltage. Equation 2 provides a first order approximation of the equivalent resistance Rds provided by an NMOS, where Vth is the threshold voltage of the device, and C is a constant depending on process and transistor geometry.

$$Rds = \frac{1}{C*(Vnx - Vth)} \quad \text{(Eq. 2)}$$

The resistance of 1Re is increased by changing the Vnx control lines in a successive manner. First, Vn1 is gradually reduced, then Vn2, then Vn3, etc., so as to reduce the voltage Vnx thereby increasing the effective resistance of the MOS device. But, the overall resistance is also affected by resistor Rnx, which has several effects. By limiting the contribution of total resistance of the MOS devices, it reduces the sensitivity of resistor 1Re to the control voltage, reduces the effect of the MOS's nonlinearity, and helps confine the transistors to the triode mode of operation.

Figure 6:
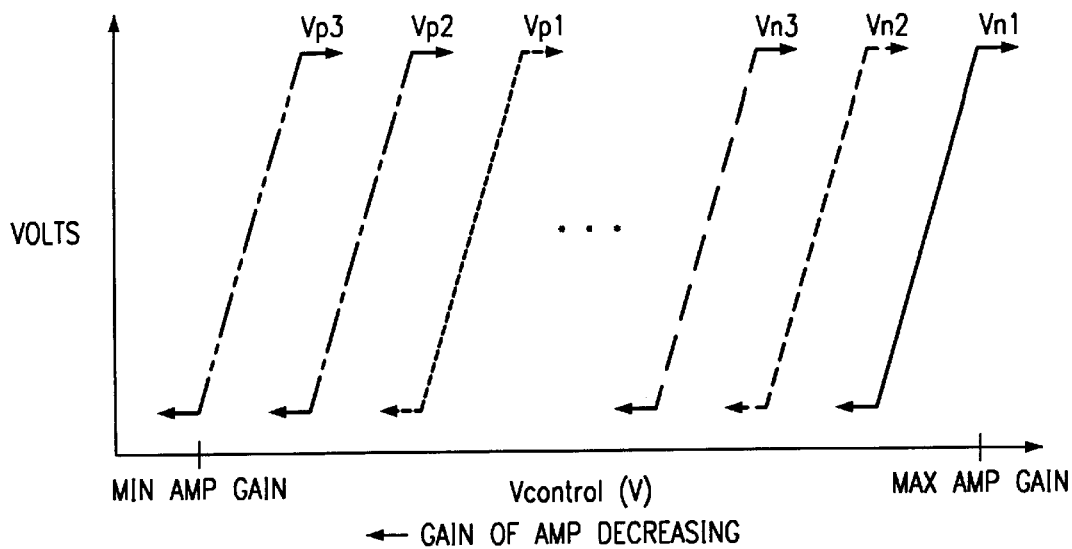
FIG. 6 shows a graph of control voltage versus differential control voltage input (gain control)

FIG. 6 shows the method of changing the Vnx control lines. 1Re's resistance is increased by changing the Vnx control lines in a successive manner. When reducing the amplifier's gain from its maximum point, first Vn1 is gradually reduced, then Vn2, then Vn3, etc., continually increasing 1Re's effective resistance. 1Rc's effective resistance is decreased after 1Re reaches its effective maximum by subsequently reducing the Vpx control lines. FIG. 6 illustrates the response of the gain control circuitry to a differential control voltage.

Figure 7:
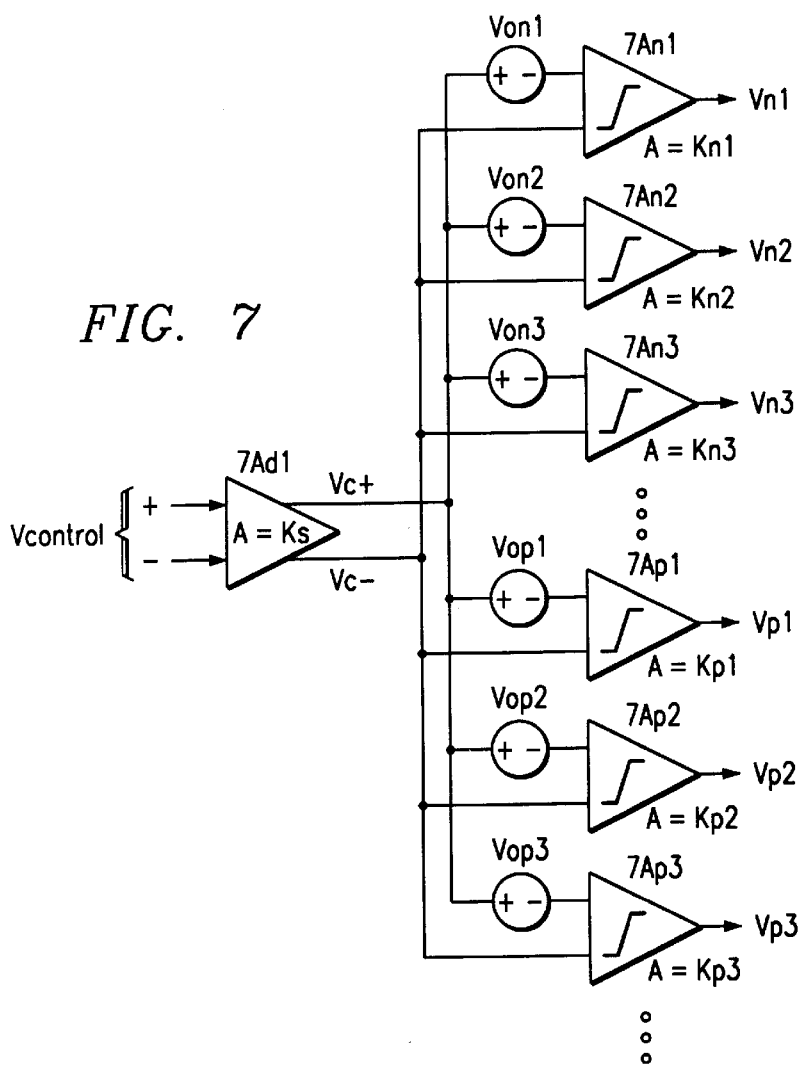
FIG. 7 shows the circuitry to accomplish the voltages shown in FIG. 6.

FIG. 7 shows a simplified diagram of the control circuitry for the voltages shown in FIG. 6. As shown, the control signal is applied to a fully differential amplifier 7Ad1 with gain Ks, which produces signal Vc. Amplifier 7Ad1 sets the sensitivity of the VLNA's gain to the applied differential control voltage Vcontrol. A larger Ks makes the VLNA's gain more sensitive with respect to Vcontrol.

Control voltage Vc is then distributed to separate amplifiers, 7An1 to 7Ap3, each controlling a Vnx or Vpx control line contained in the VLNA amplifier core. Each amplifier has an individual input offset voltage represented by a discrete voltage source at its input. The offset voltages are increased successively, starting with amplifier 7An1 and offset voltage Von1, and ending with amplifier 7Ap3 with offset Vop3. The gradually increasing offset voltages set the point where each control line will begin to change, or "breaks".

Also note that each amplifier has an individual gain Knx or Kpx, which sets the slope of the corresponding control line Vnx or Vpx during its transition. The amplifiers have a high output swing (from ground to Vcc) to correctly drive the MOS gates they control.

Returning now to FIG. 1, the steady-state bias current 1c1 and 1c2 through transistors 1Q1 and 1Q2 is determined by the value of 1Re and the voltage applied at Vb. If Vb is set to a constant value, 1c1 will be reduced as 1Re is increased. This would further reduce the gain of the amplifier (gm would decrease) and reduce OIP3. To keep a constant OIP3, a constant bias current must be maintained. As a result, when changing 1Re, Vb must be changed appropriately.

Figure 5:
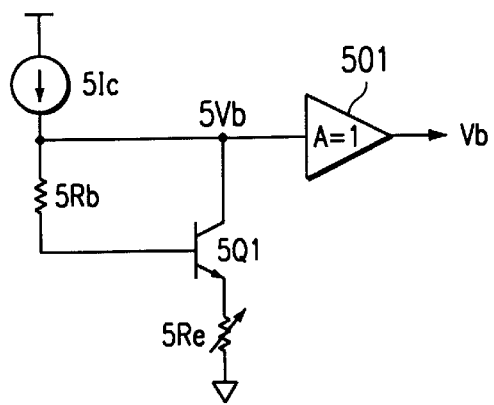
FIG. 5 shows the details of the variable voltage source used with FIG. 1.

FIG. 5 shows the circuit which generates voltage Vb. Resistors 5Rb, 5Re and transistor 5Q1 are sized to match similar components in the circuit of FIG. 1. Current 51c is the desired bias current. The actual current 1c1 and 1c2 may differ slightly due to matching of the devices. Buffer amplifier 501 drives Vb, with 5Vb as its input.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of adjusting a gain of a linear amplifier, wherein said amplifier includes at least a pair of transistors, said method comprising the steps of:

varying a set of impedances of said amplifier in a controlled linear manner so as to adjust said gain while maintaining a Third-Order Intercept Point (IP3) constant, wherein said varying step includes the step of: sequentially adding into a circuit path of said transistor pair an impedance value including one or more resistors each said resistor having associated therewith a MOS device operable for changing the effective resistance of said associated resistor, wherein said sequentially adding step includes the step of varying the gate voltage of said MOS device to control the effective resistance of said device; and adjusting bias conditions through said transistor pair consistent with the varying of said impedances.

2. The method of claim 1 wherein said transistor pair is a bipolar transistor pair and wherein said circuit path includes both the emitter path and the collector path and wherein said sequentially adding step includes the step of:

selecting in which path said impedance is to be changed.

3. The method of claim 2 wherein said selecting step includes the steps of:

maintaining said collector path impedance; and varying said emitter path impedance, wherein a Third-Order Output Intercept Point (OIP3) is maintained.

4. The method of claim 2 wherein said selecting step includes the steps of:

maintaining said emitter path impedance; and varying said collector path impedance, wherein a Third-Order Input Intercept Point (IIP3) is maintained.

5. The method of claim 1 wherein said transistor pair is a MOS transistor pair and wherein said circuit path includes both the source path and the drain path and wherein said sequentially adding step includes the step of:

selecting into which path said impedance is to be changed.

6. The method of claim 5 wherein said selecting step includes the steps of:

maintaining said drain path impedance; and varying said source path impedance, wherein an OIP3 is maintained.

7. The method of claim 6 wherein said selecting step includes the steps of:

maintaining said source path impedance; and varying said drain path impedance, wherein an IIP3 is maintained.

8. The method of claim 1 wherein said bias conditions comprise voltages and current.

9. A method of operating an amplifier comprising at least one pair of bipolar transistors, said method including the steps of:

decreasing the gain of said amplifier from a high value while holding a third order output intercept (OIP3) of said amplifier constant while a third order input intercept (IIP3) of said amplifier increases, wherein said decreasing said gain step includes the steps of varying an emitter impedance and maintaining a collector impedance; and below a transition point continuing to decrease said gain while maintaining a constant IIP3 and while decreasing said OIP3, wherein said continuing to decrease step includes the steps of varying said collector impedance and maintaining said emitter impedance.

10. The method of claim 9 further comprising the step of:

gradually degrading the noise figure of said amplifier as said gain is decreased.

11. The method of claim 10 wherein said noise figure degrading is less per unit of gain decrease above a transition point than it is below said last-mentioned transition point.

12. The method of claim 10 wherein the slope of said degradation above said transition point is less than 1 dB of noise figure for each dB of gain decrease.

13. The method of claim 9 wherein said transition point is at 0 dB of gain.

14. The method of claim 9 wherein said high value is greater than 15 dB.

15. The method of claim 9 wherein said gain is decreased to less than −20 dB.

16. The method of claim 9 wherein said constant OIP3 is greater than 70 dBmV.

17. The method of claim 9 wherein said constant IIP3 is greater than 55 dBmV.

18. A method of amplifying cable channel signals, wherein said signals require high output linearity, said method including the steps of:

passing said signals through a gain stage circuit path of an amplifier, said amplifier comprising a pair of bipolar transistors; and selectively varying the impedance in said gain stage circuit path in a highly controlled linear fashion responsive to said high output linearity requirement of said signals, wherein said selectively varying comprises:
varying an emitter impedance; and
maintaining a collector impedance.

19. A method of amplifying cable channel signals, wherein said signals require high output linearity, said method comprising the steps of:

passing said signals through a gain stage circuit path of an amplifier, said amplifier comprising a pair of MOS transistors; and selectively varying the impedance in said gain stage circuit path in a highly controlled linear fashion responsive to a linearity requirement of said signals, wherein said selectively varying step comprises:
varying a source impedance; and
maintaining a drain impedance.

20. A method of amplifying antenna channel signals, wherein said signals require a high input linearity, said method including the steps of:

passing said signals through a gain stage circuit path of an amplifier, said amplifier comprising a pair of bipolar transistors; and selectively varying the impedance in said gain stage circuit path in a highly controlled linear fashion responsive to a linearity requirement of said signals, wherein said selectively varying step includes:
varying a collector impedance; and
maintaining an emitter impedance.

21. A method of amplifying antenna channel signals, wherein said signals require high input linearity, said method including the steps of:
passing said signals through a gain stage circuit path of an amplifier, said amplifier comprising a pair of MOS transistors; and
selectively varying the impedance in said gain stage circuit path in a highly controlled linear fashion responsive to a linearity requirement of said signals, wherein said selectively varying step includes:
varying a drain impedance; and
maintaining a source impedance.

22. A method of operating an amplifier comprising at least one pair of MOS transistors, said method including the steps of:
decreasing the gain of said amplifier from a high value while holding a third order output intercept (OIP3) of said amplifier constant while a third order input intercept (IIP3) of said amplifier increases, wherein said decreasing said gain step includes the steps of varying a source impedance and maintaining a drain impedance; and
below a transition point continuing to decrease said gain while maintaining a constant IIP3 and while decreasing said OIP3, wherein said continuing to decrease step includes the step of varying said drain impedance and maintaining said source impedance.

23. The method of claim 22 further comprising the step of:
gradually degrading the noise figure of said amplifier as said gain is decreased.

24. The method of claim 23 wherein said noise figure degrading is less per unit of gain decrease above a transition point than it is below said last-mentioned transition point.

25. The method of claim 23 wherein the slope of said degradation above said transition point is less than 1 dB of noise figure for each dB of gain decrease.

26. The method of claim 22 wherein said transition point is at 0 dB of gain.

27. The method of claim 22 wherein said high value is greater than 15 dB.

28. The method of claim 22 wherein said gain is decreased to less than −20 dB.

29. The method of claim 22 wherein said constant OIP3 is greater than 70 dBmV.

30. The method of claim 22 wherein said constant IIP3 is greater than 55 dBmV.

* * * * *